(12) United States Patent
West et al.

(10) Patent No.: US 10,147,784 B2
(45) Date of Patent: Dec. 4, 2018

(54) HIGH VOLTAGE GALVANIC ISOLATION DEVICE

(71) Applicant: Texas Instruments Incorporated, Dallas, TX (US)

(72) Inventors: Jeffrey Alan West, Dallas, TX (US); Thomas D. Bonifield, Dallas, TX (US); Byron Lovell Williams, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 5 days.

(21) Appl. No.: 15/606,158

(22) Filed: May 26, 2017

(65) Prior Publication Data

US 2017/0263696 A1 Sep. 14, 2017

Related U.S. Application Data

(63) Continuation-in-part of application No. 15/045,449, filed on Feb. 17, 2016, now Pat. No. 9,768,245, which
(Continued)

(51) Int. Cl.
*H01L 49/02* (2006.01)
*H01L 29/06* (2006.01)
(Continued)

(52) U.S. Cl.
CPC .......... *H01L 28/91* (2013.01); *H01L 21/0214* (2013.01); *H01L 21/0217* (2013.01); *H01L 21/02164* (2013.01); *H01L 21/823481* (2013.01); *H01L 28/00* (2013.01); *H01L 28/40* (2013.01); *H01L 28/60* (2013.01); *H01L 29/0692* (2013.01); *H01L 29/66477* (2013.01); *H01L 29/78* (2013.01); *H01L 27/0629* (2013.01); *H01L 29/7833* (2013.01)

(58) Field of Classification Search
CPC ...................................................... H01L 28/91
See application file for complete search history.

(56) References Cited

U.S. PATENT DOCUMENTS 5,618,749 A 4/1997 Takahashi
5,814,875 A 9/1998 Kumazaki
(Continued)

*Primary Examiner* — Igwe U Anya
(74) *Attorney, Agent, or Firm* — Tuenlap D. Chan; Charles A. Brill; Frank D. Cimino

(57) ABSTRACT

A microelectronic device contains a high voltage component having a high voltage node and a low voltage node. The high voltage node is isolated from the low voltage node by a main dielectric between the high voltage node and low voltage elements at a surface of the substrate of the microelectronic device. A lower-bandgap dielectric layer is disposed between the high voltage node and the main dielectric. The lower-bandgap dielectric layer contains at least one sublayer with a bandgap energy less than a bandgap energy of the main dielectric. The lower-bandgap dielectric layer extends beyond the high voltage node continuously around the high voltage node. The lower-bandgap dielectric layer has an isolation break surrounding the high voltage node at a distance of at least twice the thickness of the lower-bandgap dielectric layer from the high voltage node.

20 Claims, 16 Drawing Sheets

Related U.S. Application Data is a continuation of application No. 14/277,851, filed on May 15, 2014, now Pat. No. 9,299,697.

(60) Provisional application No. 62/345,134, filed on Jun. 3, 2016.

(51) Int. Cl.
    *H01L 21/02*     (2006.01)
    *H01L 21/8234*     (2006.01)
    *H01L 29/66*     (2006.01)
    *H01L 29/78*     (2006.01)
    *H01L 27/06*     (2006.01)

(56) References Cited

U.S. PATENT DOCUMENTS

| | | | |
|---|---|---|---|
| 6,218,282 B1 * | 4/2001 | Buynoski | H01L 21/7682 257/410 |
| 6,423,584 B2 | 7/2002 | Takahashi | |
| 6,441,419 B1 | 8/2002 | Johnson | |
| 7,405,149 B1 * | 7/2008 | Lin | H01L 21/768 257/E21.004 |
| 8,101,477 B1 | 1/2012 | Power | |
| 8,405,189 B1 | 3/2013 | Ward | |
| 8,890,223 B1 * | 11/2014 | Bonifield | H01L 27/0288 257/296 |
| 8,921,988 B2 | 12/2014 | Hsu | |
| 9,087,853 B2 | 7/2015 | Tao | |
| 2002/0179974 A1 | 12/2002 | Noda | |
| 2004/0245637 A1 * | 12/2004 | Horak | H01L 21/7682 257/758 |
| 2005/0215022 A1 | 9/2005 | Adam | |
| 2006/0077713 A1 | 4/2006 | Ito | |
| 2006/0145251 A1 | 7/2006 | Ko | |
| 2006/0189089 A1 | 8/2006 | Larkin | |
| 2007/0296085 A1 | 12/2007 | Coolbaugh | |
| 2008/0185682 A1 | 8/2008 | Alter | |
| 2009/0095995 A1 | 4/2009 | Kawashima | |
| 2009/0108323 A1 | 4/2009 | Jee | |
| 2010/0032741 A1 | 2/2010 | Ueno | |
| 2010/0052084 A1 | 3/2010 | Yang | |
| 2010/0059851 A1 | 3/2010 | Ellis | |
| 2011/0244666 A1 | 10/2011 | Kim | |
| 2012/0146124 A1 | 6/2012 | Hafez | |
| 2012/0162947 A1 | 6/2012 | O'Donnell | |
| 2012/0205251 A1 | 8/2012 | Kalkan | |
| 2012/0211868 A1 | 8/2012 | Stribley | |
| 2013/0001738 A1 | 1/2013 | Dong | |
| 2013/0037909 A1 | 2/2013 | French | |
| 2014/0145297 A1 | 5/2014 | Daamen | |
| 2014/0145301 A1 | 5/2014 | Moghe | |
| 2014/0252551 A1 | 9/2014 | Dix | |
| 2014/0253227 A1 | 9/2014 | Yach | |
| 2014/0264740 A1 | 9/2014 | Stribley | |
| 2014/0312296 A1 | 10/2014 | Jo | |
| 2015/0115407 A1 | 4/2015 | Tao | |
| 2015/0187781 A1 | 7/2015 | Hong | |
| 2015/0200307 A1 | 7/2015 | Matsuo | |
| 2015/0214292 A1 | 7/2015 | Tao | |
| 2015/0294726 A1 | 10/2015 | Sim | |

* cited by examiner

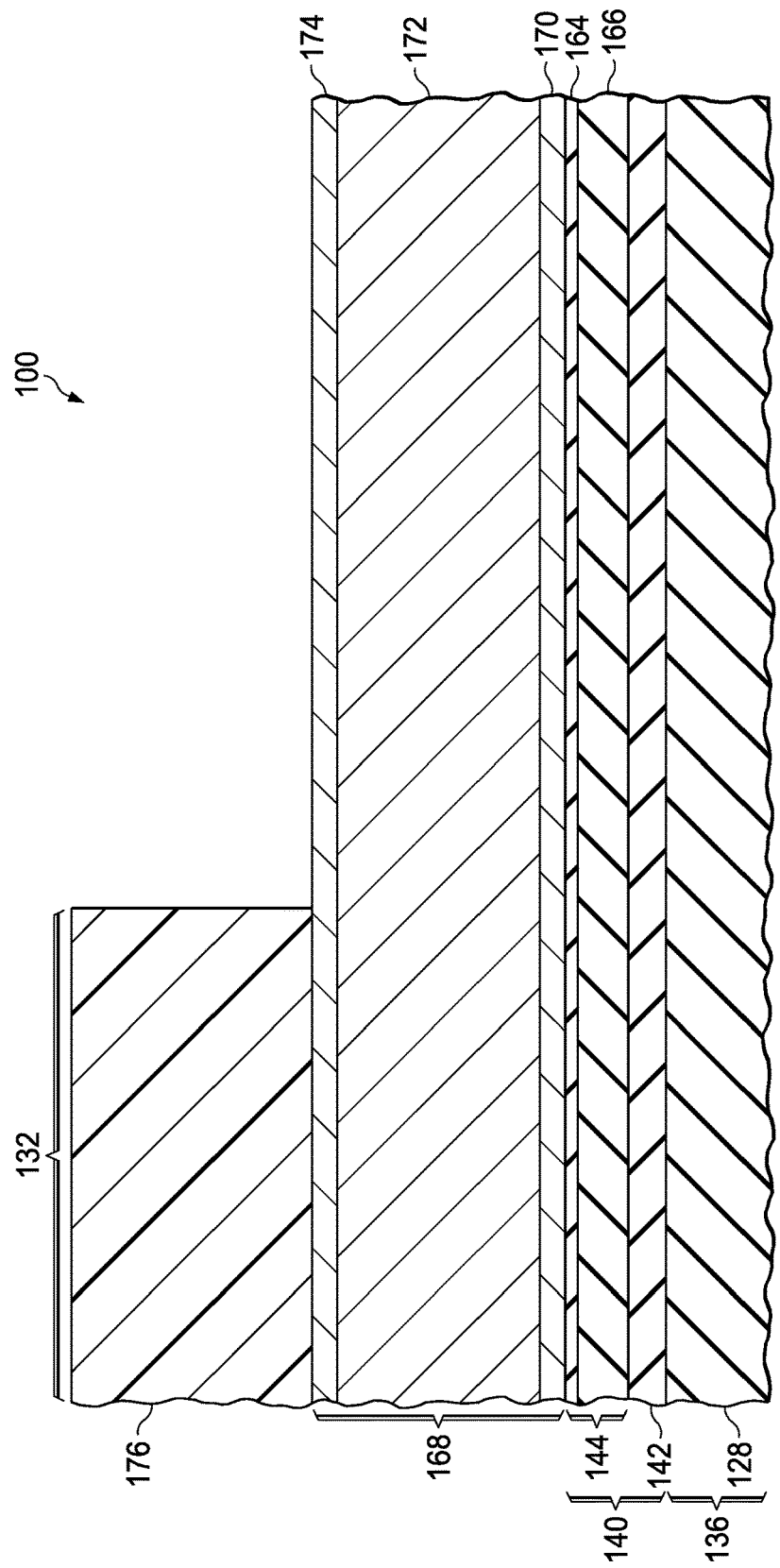

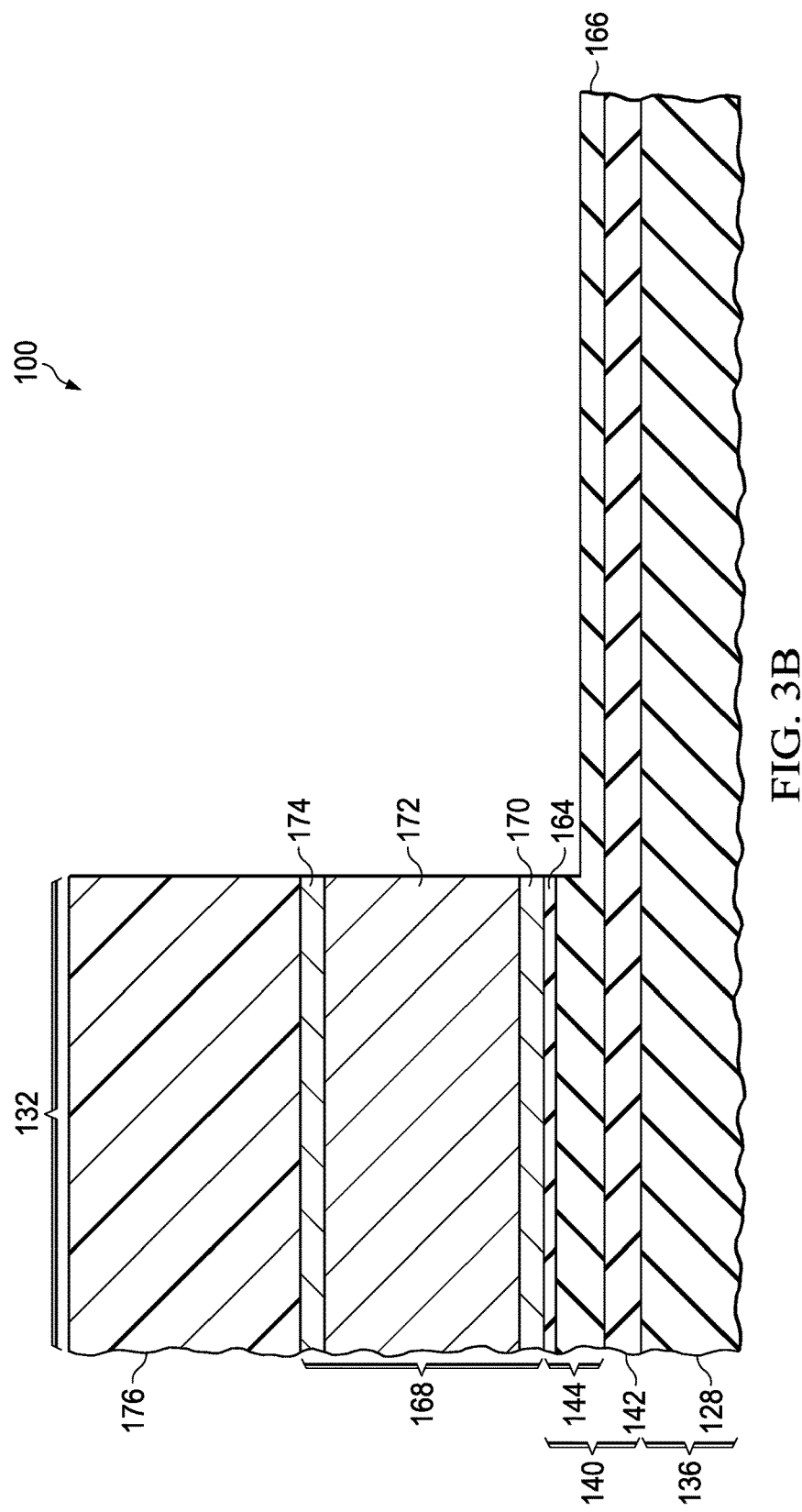

HIGH VOLTAGE GALVANIC ISOLATION DEVICE

CROSS-REFERENCE TO RELATED APPLICATIONS

Under 35 U.S.C. § 119(e), this non-provisional application claims the benefit of priority to U.S. Provisional App. No. 62/345,134, filed on Jun. 3, 2016, the entirety of which is hereby incorporated herein by reference. Under 35 U.S.C. §§ 120-121, this continuation-in-part (CIP) application claims the benefit of priority to U.S. patent application Ser. No. 15/045,449, filed on Feb. 17, 2016, which is a continuation application claiming benefits of priority to U.S. patent application Ser. No. 14/277,851, filed on May 15, 2014, and issued as U.S. Pat. No. 9,299,697 on Mar. 29, 2016. The entirety of the above referenced applications are hereby incorporated herein by reference.

FIELD

This disclosure relates to the field of microelectronic devices. More particularly, this disclosure relates to high voltage components in microelectronic devices.

BACKGROUND

A microelectronic device with a high voltage component having a high voltage node, operable at a potential greater than 100 volts, may have a thin lower-bandgap dielectric layer between the high voltage node and a main dielectric which is several microns thick separating the high voltage node from low voltage components. The lower-bandgap dielectric layer, with a thickness commonly less than 10 percent of the thickness of the main dielectric, has a bandgap energy less than the main dielectric, and provides reliability for the main dielectric by reducing peak electric fields at corners of the high voltage node. However, the lower-bandgap dielectric layer supports other reliability degradation mechanisms which undesirably limit overall reliability of the microelectronic device.

SUMMARY OF THE DISCLOSURE

A microelectronic device contains a high voltage component having a high voltage node and a low voltage node. The high voltage node is isolated from the low voltage node by a main dielectric between the high voltage node and low voltage elements formed near a surface of a substrate of the microelectronic device. A lower-bandgap dielectric layer is disposed between the high voltage node and the main dielectric. The lower-bandgap dielectric layer contains at least one sub-layer with a bandgap energy less than a bandgap energy of the main dielectric. The lower-bandgap dielectric layer extends beyond the high voltage node continuously around the high voltage node. The lower-bandgap dielectric layer has an isolation break surrounding the high voltage node at a distance of at least twice the thickness of the lower-bandgap dielectric layer from the high voltage node.

DESCRIPTION OF THE VIEWS OF THE DRAWING

FIG. 3A through FIG. 3C are cross sections of the microelectronic device of FIG. 1 at the isolation break, depicting an alternate method of forming the isolation break and high voltage node.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device contains a high voltage component having a high voltage node and a low voltage node. The high voltage node is isolated from the low voltage node by a main dielectric between the high voltage node and low voltage elements formed at a surface of a substrate of the microelectronic device. A lower-bandgap dielectric layer is disposed between the high voltage node and the main dielectric. The lower-bandgap dielectric layer contains at least a first sub-layer and a second sub-layer. The first sub-layer is above the main dielectric layer, whereas the second sub-layer is above the first sub-layer and having a bandgap energy less than a bandgap energy of the main dielectric. The lower-bandgap dielectric layer extends beyond the high voltage node continuously around the high voltage node. An isolation break segmented the second sub-layer into two portions: a first portion that co-extend with the low voltage node, and a second portion that is free of overlapping with the low voltage node. Surrounding the first portion of the second sub-layer, the isolation break is positioned below the high voltage node at a lateral distance of at least twice the thickness of the lower-bandgap dielectric layer from the high voltage node. The isolation break terminates near (or lands in) the first sub-layer, such that the first sub-layer extends contiguously across and under the segmented second sub-layer. The isolation break is located between the high voltage node and low voltage elements of the microelectronic device.

Figure 1:
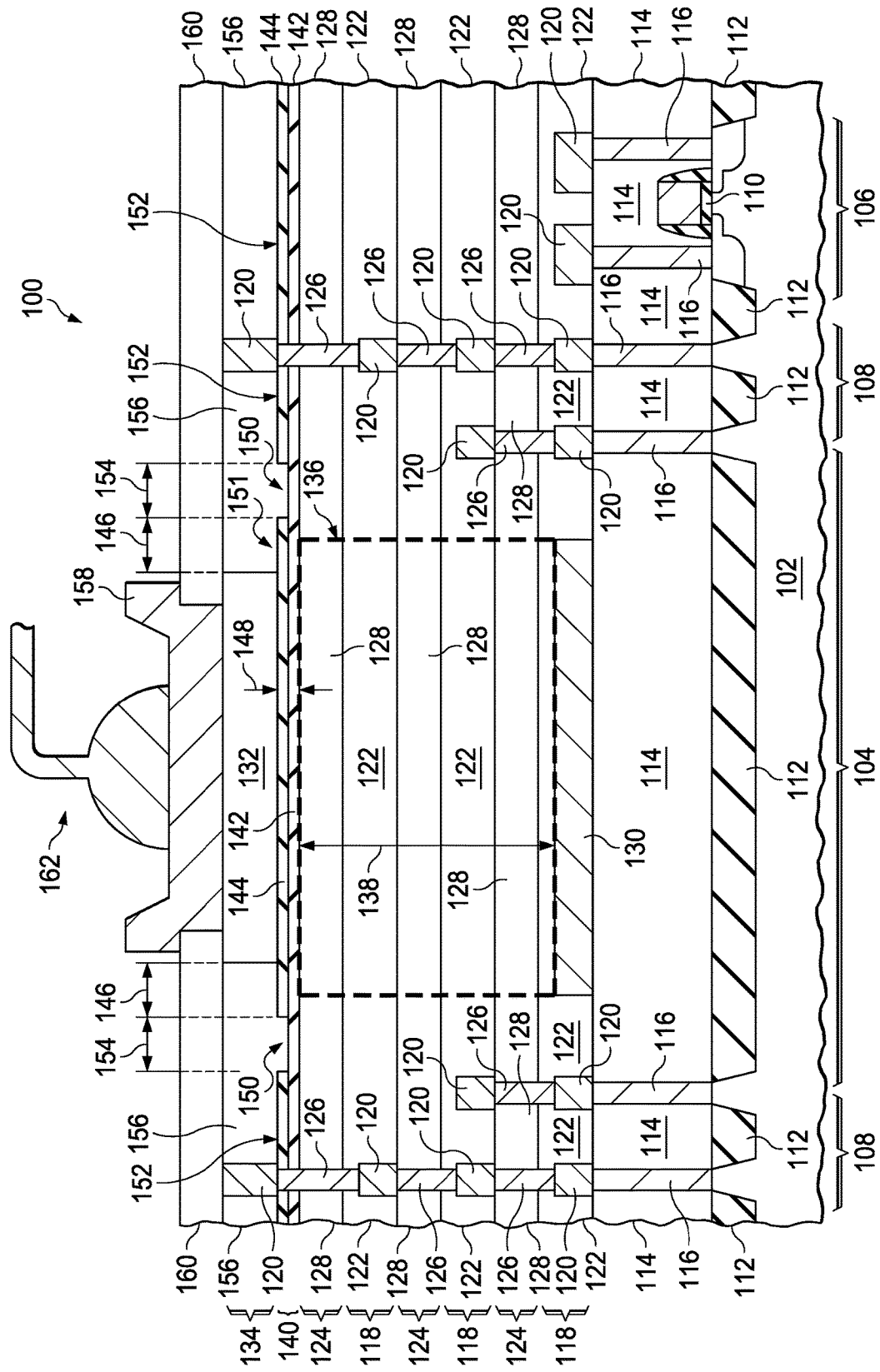
FIG. 1 is a cross section of an example microelectronic device containing a high voltage component.

FIG. 1 is a cross section of an example microelectronic device containing a high voltage component. In the instant example, the microelectronic device 100 is described as an integrated circuit 100. Other configurations for the microelectronic device 100 such as a standalone component or a hybrid circuit, are within the scope of the instant example. The microelectronic device 100 is formed on a substrate 102 such as a silicon wafer. The microelectronic device 100 includes the high voltage component 104, depicted in FIG. 1 as a high voltage capacitor 104, and possibly a low voltage component 106 which operates at 24 volts or less, depicted as a metal oxide semiconductor (MOS) transistor 106 with a gate dielectric layer 110 less than 70 nanometers thick. The microelectronic device 100 may optionally include a faraday cage 108 around the high voltage component 104.

Field oxide 112 may be formed in the substrate 102 to laterally isolate elements of the microelectronic device 100. A pre-metal dielectric (PMD) layer 114 is formed over the substrate 102. Contacts 116 are disposed through the PMD layer 114 to provide electrical connections for the low voltage component 106 and the faraday cage 108.

A plurality of metal levels 118 are disposed over the PMD layer 114. The metal levels 118 include metal interconnects 120 connected to the low voltage component 106 and the faraday cage 108. Intra-metal dielectric (IMD) layers 122 of silicon dioxide-based dielectric material are disposed between the metal interconnects 120 in each metal level 118. Via levels 124 are disposed between the metal levels 118. The via levels 124 include metal vias 126 connecting the metal interconnects 120. The metal vias 126 are disposed through inter-level dielectric (ILD) layers 128 of silicon dioxide-based dielectric material in each via level 124. Other dielectric materials for the IMD layers 122 and the ILD layers 128, such as low-k materials, are within the scope of the instant example. The IMD layers 122 and the ILD layers 128 may possibly include cap layers and etch stop layers of different dielectric materials, such as silicon nitride. The IMD layers 122 may be parts of the corresponding ILD layers 128, depending on the process sequence used to form the plurality of metal levels 118.

A low voltage node 130 of the high voltage component 104, depicted as a lower conductive plate (also designated with the numeric label 130) of the high voltage capacitor 104, is disposed in one of the metal levels 118, for example a first metal level 118 as depicted in FIG. 1. A high voltage node 132 of the high voltage component 104, depicted as an upper conductive plate (also designated with the numeric label 132) of the high voltage capacitor 104, is disposed in another metal level 134, for example a top metal level 134 as depicted in FIG. 1. The combined IMD layers 122 and ILD layers 128 between the low voltage node 130 and the high voltage node 132 provide a main dielectric (or a first dielectric layer) 136 of the high voltage component 104. In the instant example, the main dielectric 136 is a capacitor dielectric 136 of the high voltage capacitor 104. A thickness 138 of the capacitor dielectric 136 is at least 2 microns and may be determined by a desired operating voltage of the upper plate 132 relative to the lower plate 130 and possibly the substrate 102. For example, a version of the high voltage capacitor 104 in which the upper plate 132 is designed to operate at 1000 volts may have a capacitor dielectric 136 with a thickness 138 of 8 microns to 12 microns.

A lower-bandgap dielectric layer (or a second dielectric layer) 140 is disposed between the main dielectric 136 and the high voltage node 132, opposite from the low voltage node 130. The lower-bandgap dielectric layer 140 includes at least one dielectric sub-layer with a bandgap energy less than a bandgap energy of a portion of the main dielectric 136 facing the high voltage node 132. In the instant example, the lower-bandgap dielectric layer 140 includes: a first sub-layer 142 (e.g., silicon oxide nitride), which may be 200 nanometers to 600 nanometers thick, contacting or being positioned above the main dielectric 136; and a second sub-layer 144 (e.g., silicon nitride), which may be 200 nanometers to 600 nanometers thick, and which is positioned between, and may be contacting, the first sub-layer 142 and the high voltage node 132. The first sub-layer 142 may include silicon oxide nitride (SiON), which has a lower bandgap energy than the silicon dioxide-based dielectric material of the main dielectric 136, and the second sub-layer 144 may include silicon nitride, which has a lower bandgap energy than the first sub-layer 142. The second sub-layer 144 of the lower-bandgap dielectric layer 140 extends past the high voltage node 132, continuously around the high voltage node 132, by a lateral distance 146 which is at least twice a thickness 148 of the lower-bandgap dielectric layer 140. An isolation break 150 extends into the second sub-layer 144 of the lower-bandgap dielectric layer 140. Laterally surrounding the high voltage node 132, the isolation break 150 is spaced apart from the high voltage node 132 by at least the lateral distance 146.

The isolation break 150 divides the second sub-layer 144 into a first portion 151 and a second portion 152. The first portion 151 is an island circumscribed, or laterally surrounded, by the isolation break 150, whereas the second portion 152 is completely separated, and thus isolated, from the first portion 151 by the isolation break 150. The first portion 151 may be referred to as the high voltage portion as it interfaces between the high voltage node 132 and the low voltage node 130. More specifically, the first portion co-extends with the lower conductive plate 130 and the upper conductive plate 132. The second portion 152 may be referred to as the low voltage portion as it is isolated from the high voltage node 132 by the isolation break 150. More specifically, the second portion is free of overlapping with the lower conductive plate 130 and the upper conductive plate 132.

The low voltage portion 152 may be disposed external to the isolation break 150 so that the low voltage portion 152 is separated from the high voltage portion 151 that contacts the high voltage node 132 by the isolation break 150. The low voltage portion 152 of the lower-bandgap dielectric layer 140 may contact low voltage elements of the microelectronic device 100 which extend up to the lower-bandgap dielectric layer 140, such as the faraday cage 108. The isolation break 150 is located between the high voltage node 132 and any low voltage element of the microelectronic device 100, so that the second sub-layer 144 does not simultaneously contact the high voltage node 132 and a low voltage element.

To sustain a high breakdown voltage, the isolation break 150 has a bandgap energy higher than the second dielectric layer 140. The isolation break 150 may terminate near the first sub-layer 142. In one implementation, the isolation break 150 may protrude partially into the first sub-layer 142 but without completely separating the first sub-layer 142 into two separate portions. In another implementation, the isolation break 150 does not protrude into the first sub-layer 142. In either case, the first sub-layer 142 extends under the isolation break 140 and contiguously coextends with the first (main) dielectric layer 136 thereunder. As such, the first sub-layer 142 covers a wider area than the first portion 151 of the second sub-layer 144.

The isolation break 150 advantageously prevents leakage current through an interface of the lower-bandgap dielectric layer 140 from the high voltage node 132 to a low voltage element of the microelectronic device 100. The low voltage portion 152 of the second sub-layer 144, if present, is laterally separated from the high voltage portion 151 by an isolation distance 154. In one aspect, the isolation distance 154 may be at least 1 micron. In another aspect, the isolation distance 154 may range from 10 microns to 25 microns, which provides a sufficient process margin in a lithographic process for forming the isolation break 150. Forming the lower-bandgap dielectric layer 140 with the isolation break 150 is particularly advantageous for instances of the high voltage component 104 which operate at 1000 volts or higher, as such a component without the lower-bandgap dielectric layer 140 with the isolation break 150 would have such low reliability as to preclude a useful embodiment of the device 100.

Moreover, landing the isolation break 150 near (e.g., slightly above or into) the first sub-layer 142 provides several advantages over fully extending the isolation break 150 into and through the first sub-layer 142. First, the contiguous first sub-layer 142 may advantageously enhance the surge protection provided by the isolated first portion 151 of the second sub-layer 144 without incurring any design penalty. Second, by not substantially extending into the first sub-layer 142, the isolation break 150 can be fabricated with a lower-cost process as well. Third, by landing within the first sub-layer 142, the isolation break 150 enhances the overall breakdown strength and surge performance of the high voltage component 104.

The high voltage node 132 is disposed in an upper IMD layer 156, which covers edges of the lower-bandgap dielectric layer 140 at the isolation break 150. The upper IMD layer 156 may include silicon dioxide, similar to the main dielectric 136. The high voltage node 132 may be connected to, or may be part of, a bondpad 158 of the microelectronic device 100, as depicted in FIG. 1. Alternatively, the high voltage node 132 may incorporate, or serve as, a bond pad such that the layer 158 may be omitted. A protective overcoat 160 includes polyimide, silicon nitride, silicon oxide nitride, and/or silicon dioxide may be disposed over the high voltage node 132 or may overlap edges of the high voltage node 132 as depicted in FIG. 1. In one implementation, for example, the protective overcoat 160 may include polyimide on silicon oxynitride, which is on silicon dioxide. An electrical connection 162 to the high voltage node 132 may be made through a wirebond 162. The low voltage portion 152 of the lower-bandgap dielectric layer 140 may advantageously shield the low voltage components 106 from electric fields from the electrical connection 162 to the high voltage node 132.

During operation of the microelectronic device 100, when a high voltage is applied to the high voltage node 132 and a low voltage is applied to the low voltage node 130, the lower-bandgap dielectric layer advantageously provides reliability for the main dielectric 136 by reducing an electric field at corners of the high voltage node 132. The isolation break 150 advantageously provides reliability by preventing excessive leakage current through the lower-bandgap dielectric layer 140 from the high voltage node 132 to a low voltage element of the microelectronic device 100. By cutting off the excessive leakage current, the isolation break 150 enhances the ramp-to-breakdown capability and time-dependent-dielectric-breakdown capability of the high voltage component 104 without causing damage to the high voltage portion 151 of the second sub-layer 144.

Figure 2A:
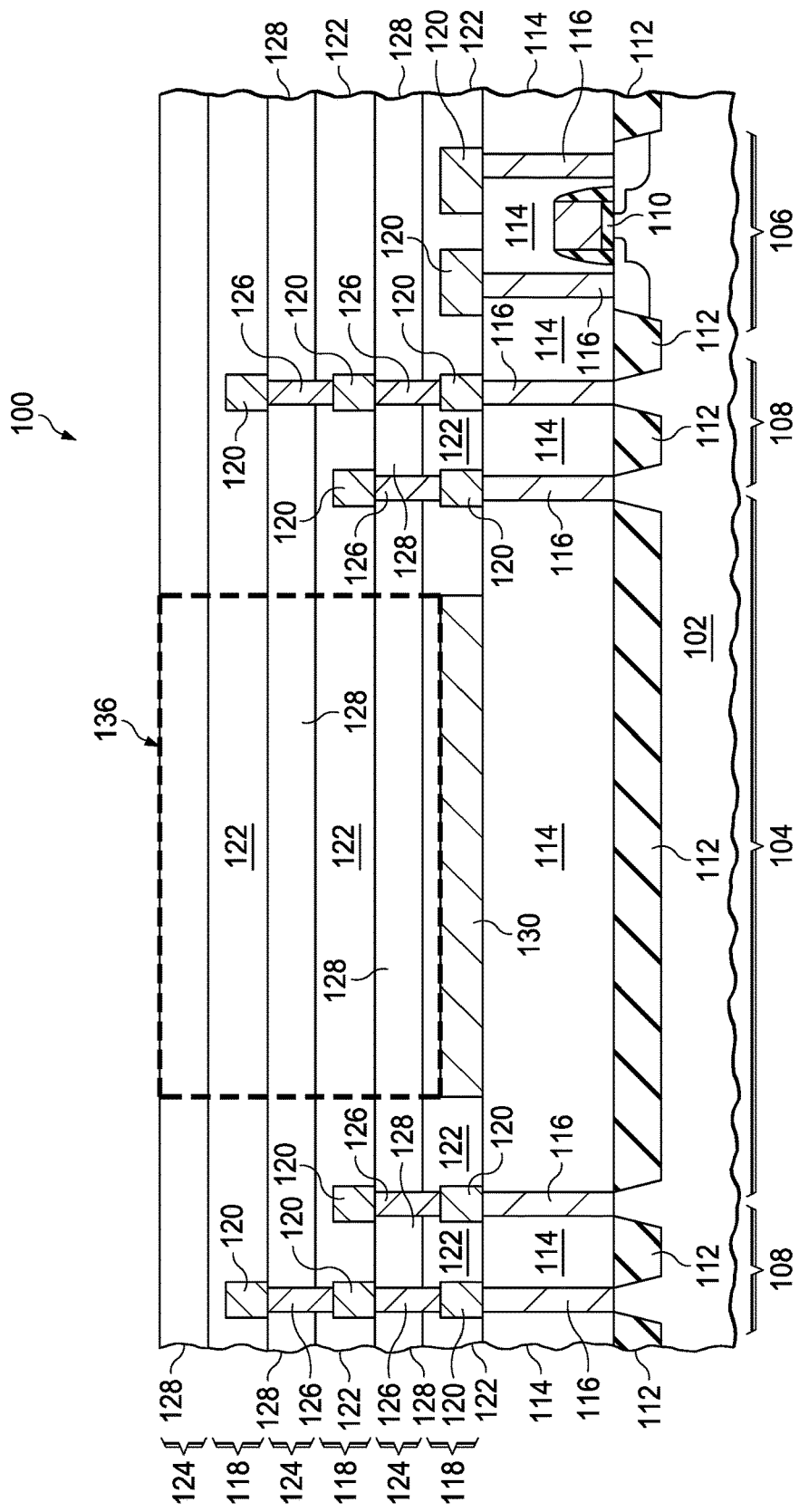
FIG. 2A through FIG. 2F are cross sections of the microelectronic device of FIG. 1, depicted in successive stages of fabrication.

FIG. 2A through FIG. 2F are cross sections of the microelectronic device of FIG. 1, depicted in successive stages of fabrication. Referring to FIG. 2A, the microelectronic device 100 is formed on the substrate 102, which may be a silicon wafer or other semiconductor substrate, or may be a dielectric substrate such as sapphire or aluminum oxide ceramic. In versions of the instant example in which the substrate 102 is a semiconductor substrate, the field oxide 112 may be formed to laterally isolate elements of the microelectronic device 100 in the substrate 102. The field oxide 112 may be formed by a shallow trench isolation (STI) process, a local oxidation of silicon (LOCOS) process or other method.

The low voltage component 106 is formed in and on the substrate 102. The low voltage component 106 may be proximate to the high voltage component 104, and may be separated from the high voltage component 104 by the faraday cage 108.

The PMD layer 114 is formed over the substrate 102. The PMD layer 114 may include a dielectric layer stack including a silicon nitride or silicon dioxide PMD liner 10 to 100 nanometers thick formed by a plasma enhanced chemical vapor deposition (PECVD) process, a layer of silicon dioxide, phosphorus silicate glass (PSG) or boron phosphorus silicate glass (BPSG) formed by a PECVD process, commonly 100 to 1000 nanometers thick, commonly leveled by a chemical-mechanical polish (CMP) process, and an optional PMD cap layer, commonly 10 to 100 nanometers of a hard material such as silicon nitride, silicon carbide nitride or silicon carbide formed by another PECVD process. Contact holes are formed through the PMD layer 114 to expose the substrate 102, for example in the low voltage component 106 and the faraday cage 108 and possibly in the high voltage component 104. The contacts 116 are formed in the contacts holes to provide electrical connections. The contacts 116 may be formed by forming a liner of titanium and titanium nitride using a sputter process and an atomic layer deposition (ALD) process respectively, forming a tungsten layer on the liner using a metal organic chemical vapor deposition (MOCVD) process to fill the contact holes, and removing the tungsten and liner from a top surface of the PMD layer 114 using an etchback and/or a CMP process.

The metal levels 118 and IMD layers 122, and the via levels 124 and the ILD layers 128, may be formed by any of several methods. In one version of the instant example, any of the metal levels 118 may be formed by forming an aluminum-based interconnect metal layer over the underlying PMD layer 114 or ILD layer 128. The aluminum-based interconnect metal layer may include an adhesion layer of titanium, titanium tungsten or titanium nitride, an aluminum layer containing a few percent silicon, titanium and/or copper, 200 nanometers to several microns thick, on the adhesion layer, and possibly an anti-reflection layer of titanium or titanium nitride on the aluminum layer. An interconnect etch mask including photoresist is formed over the interconnect metal layer covering areas for the metal interconnects 120, and an etch process such as a plasma etch using chlorine radicals is used to remove the interconnect metal layer in areas exposed by the interconnect etch mask, leaving the metal interconnects 120. The corresponding IMD layer 122 is subsequently-formed between the metal interconnects 120. The IMD layer 122 may be formed by depositing a layer of silicon dioxide-based dielectric material by a PECVD process using tetraethyl orthosilicate, also known as tetraethoxysilane (TEOS), and subsequently planarizing the dielectric material by a resist etchback process or a CMP process, so that the IMD layer 122 covers metal interconnects 120 as shown in FIG. 1. The IMD layer 122 may possibly include silicon dioxide-based dielectric material formed by spin coating the microelectronic device 100 with a solution containing methylsilsesquioxane (MSQ) and subsequently baking the solution to remove volatile material.

In another version of the instant example, any of the metal levels 118 may be formed by a single damascene process in which the IMD layer 122 is formed first, and interconnect trenches are formed through the IMD layer 122 in areas for the metal interconnects 120. The IMD layer 122 may be a stack of dielectric layers including an etch stop layer, a main layer and a cap layer, formed by sequential PECVD processes. A liner of tantalum nitride is formed by an ALD process over the IMD layer 122, extending into the interconnect trenches as a conformal liner. A seed layer of sputtered copper is formed on the liner and electroplated copper is formed on the seed layer to fill the interconnect trenches. A copper CMP process removes the copper and liner from a top surface of the IMD layer 122, leaving the metal interconnects 120 in the interconnect trenches.

In a further version, the metal interconnects 120 may be formed by a liftoff process, in which a liftoff pattern of organic material such as photoresist is formed over the corresponding lower ILD layer 128 which has openings for the metal interconnects 120. Metal layers for the metal interconnects 120 are deposited over the liftoff pattern and onto the ILD layer 128 in the openings. The liftoff pattern is subsequently removed using a solvent spray, taking the metals layers on the liftoff pattern, leaving the metal interconnects 120.

In one version of the instant example, any of the via levels 124, including the corresponding vias 126 and ILD layer 128 may be formed by a similar process as described for the contacts 116. In another version, the via levels 124, including the corresponding vias 126 and ILD layer 128 may be formed by a single damascene process as described for the metal levels 118 including the metal interconnects 120 and the IMD layer 122.

In an alternate version of the instant example, any of the metal levels 118 and corresponding lower via levels 124 may be formed concurrently by a dual damascene process. In a dual damascene process, the ILD layer 128 is formed and the corresponding IMD layer 122 is formed over the ILD layer 128. Interconnect trenches are formed through the IMD layer 122 and via holes are formed through the ILD layer 128, by a sequence of pattern and etch steps, which may be, for example a trench-first sequence, a via-first sequence, or a partial via-first sequence. A liner, seed layer and electroplated copper fill metal are formed over the IMD layer 122, concurrently filling the via holes and the interconnect trenches. A subsequent copper CMP process removes the copper and liner from the top surface of the IMD layer 122, leaving the metal interconnects 120 in the interconnect trenches and the vias 126 in the via holes.

In another version of the instant example, any of the metal levels 118 may be formed by a masked plating process. An adhesion layer of titanium and a seed layer of copper are formed on a top surface of the relevant ILD layer 128. The adhesion layer makes electrical contact to underlying instances of the vias 126 or contacts 116. A plating mask of photoresist is formed over the seed layer so as to expose areas for the metal interconnects 120. An electroplating operation plates copper on the seed layer in the areas exposed by the plating mask to a desired thickness. The plating mask is removed, for example by ashing or by dissolving in a solvent. The seed layer and the adhesion layer outside the plated copper are removed, for example by reactive ion etch (RIE) processes, leaving the plated copper and underlying seed layer and adhesion layer to provide the metal interconnects 120.

The low voltage node 130 of the high voltage component 104 is formed in one of the lower metal levels 118, possibly the lowest metal level 118. The low voltage node 130 may be formed concurrently with the metal interconnects 120 in the metal level 118. Alternatively, the low voltage node 130 may possibly be formed separately from the metal interconnects 120. The ILD layers 128 and the IMD layers 122 above the low voltage node 130 provide the main dielectric 136 of the high voltage component 104.

Figure 2B:
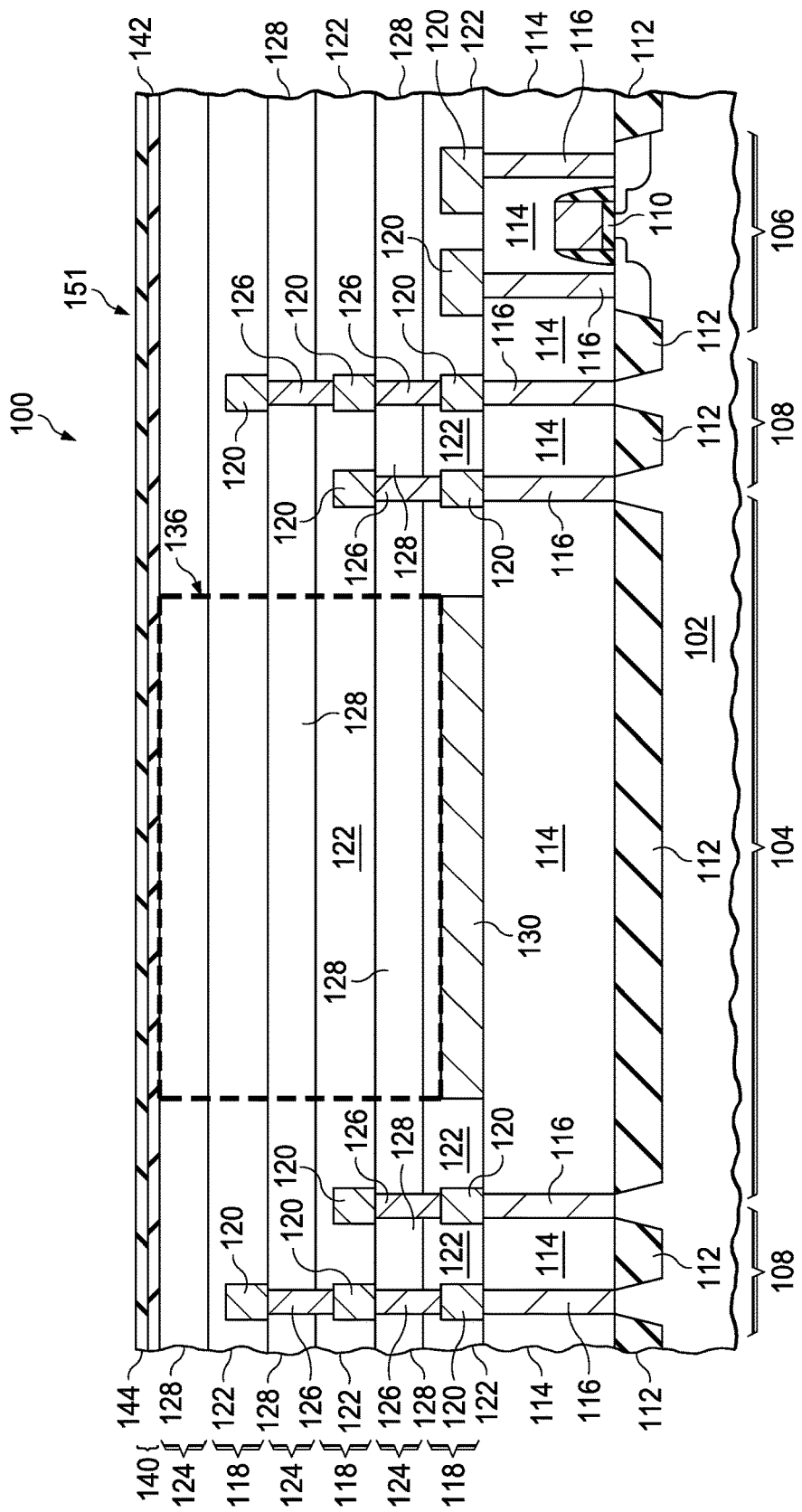

Referring to FIG. 2B, the lower-bandgap dielectric layer 140 is formed over the ILD layers 128 and the IMD layers 122 which contain the main dielectric 136 of the high voltage component 104. In the instant example, formation of the lower-bandgap dielectric layer 140 proceeds by forming the first sub-layer 142 of silicon oxide nitride, 200 nanometers to 600 nanometers thick, by a PECVD reaction using bis (tertiary-butylamino) silane (BTBAS) and TEOS. Atomic fractions of nitrogen and oxygen in the first sub-layer 142 may be selected by adjusting relative gas flows of the BTBAS and TEOS, respectively. Formation of the lower-bandgap dielectric layer 140 continues by forming the second sub-layer 144 of silicon nitride, 200 nanometers to 600 nanometers thick, by a PECVD reaction using BTBAS. In other versions of the instant example, the lower-bandgap dielectric layer 140 may consist of only one sub-layer with a bandgap energy less than the bandgap energy of the main dielectric 136. In further versions, the lower-bandgap dielectric layer 140 may have more than two sub-layers. Dielectric materials which may be used for sub-layers of the lower-bandgap dielectric layer 140 may include the dielectric materials of Table 1 below.

TABLE 1

| Dielectric Material | Bandgap Range (electron volts) |
| --- | --- |
| silicon oxide nitride | ~7.5 |
| silicon nitride | 3 to ~6 |
| silicon oxide carbide nitride | higher than silicon carbide nitride |
| silicon carbide nitride | 3.8 to 4.7 |
| tantalum pentoxide | 3.8 to 5.3 |
| Diamond-like carbon | 5.5 |
| titanium dioxide | 3.3 |
| aluminum nitride | 6.2 |
| aluminum oxide | 6.5 to 7.0 |
| silicon monoxide | lower than SiO2 |
| zinc oxide | 3.4 |

Bandgaps of variable stoichiometry materials in Table 1 such as silicon oxide nitride, silicon oxide carbide nitride and silicon carbide nitride may vary, depending on a relative atomic fraction of oxygen, nitrogen and/or carbon. Versions of silicon-containing dielectric materials which are silicon rich may provide poor performance as sub-layers of the lower-bandgap dielectric layer 140 due to less-than-desired electrical impedance.

Figure 2C:
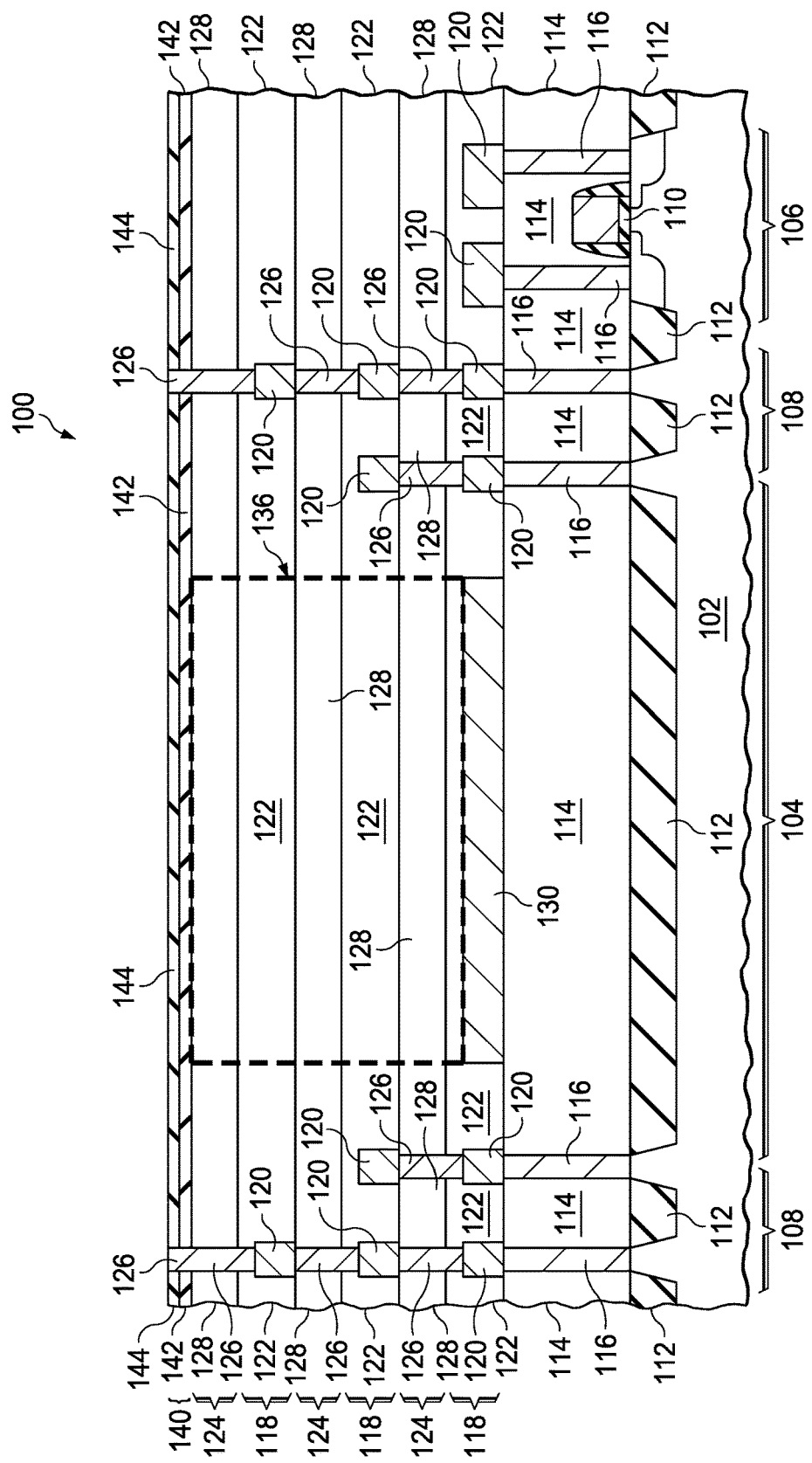

Referring to FIG. 2C, the vias 126 through the lower-bandgap dielectric layer 140 are formed after the lower-bandgap dielectric layer 140 is formed. The vias 126 through the lower-bandgap dielectric layer 140 may be formed by any of the methods described in reference to FIG. 2A.

Figure 2D:
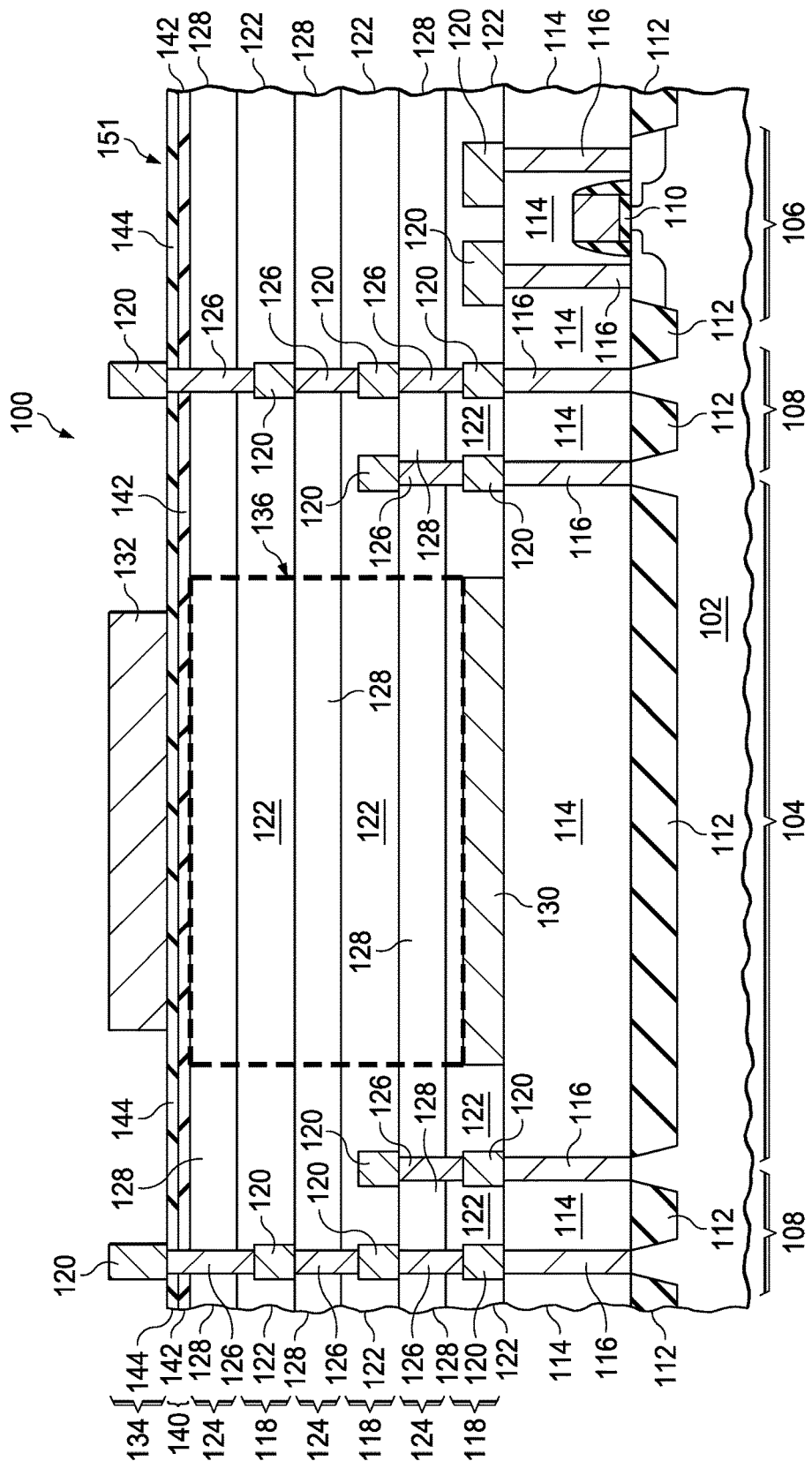

Referring to FIG. 2D, the metal interconnects 120 above the lower-bandgap dielectric layer 140 and the high voltage node 132 are formed. The metal interconnects 120 above the lower-bandgap dielectric layer 140 may be formed using any of the methods described in reference to FIG. 2A. The high voltage node 132 may be formed concurrently with the metal interconnects 120 above the lower-bandgap dielectric layer 140, or may be formed separately.

Figure 2E:
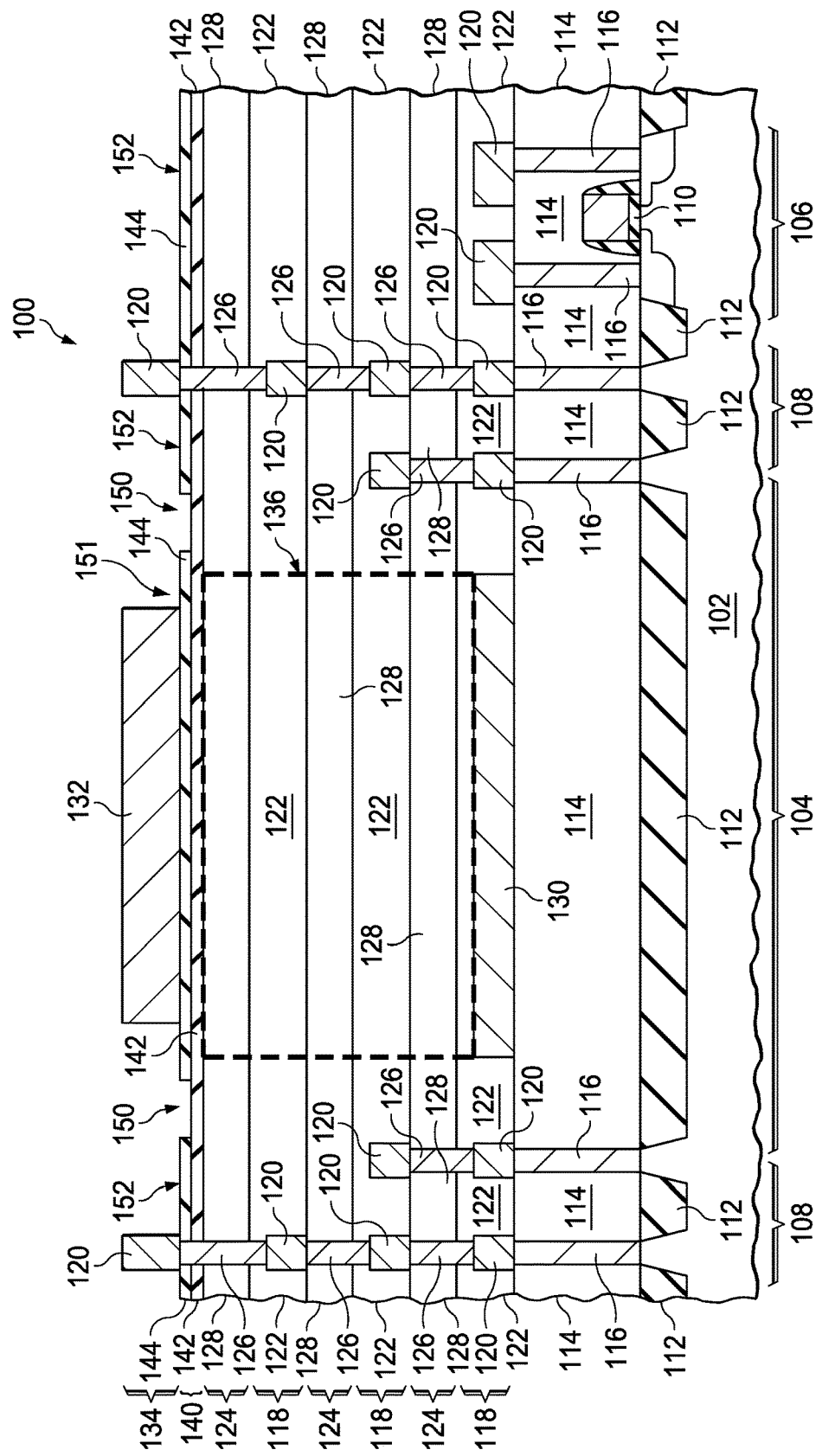

Referring to FIG. 2E, the isolation break 150 is through the second sub-layer 144 and landed near (e.g., slightly above or into) the first sub-layer 142. The isolation break 150 may be formed by placing an isolation etch mask over the lower-bandgap dielectric layer 140 and etching through the second sub-layer 144 as exposed by the isolation etch mask. The etching may extend partially into the first sub-layer 142 without reaching the ILD layer 128. The etching divides the second sub-layer 144 into the first (high voltage) portion 151 and the second (low voltage) portion 152.

Figure 2F:
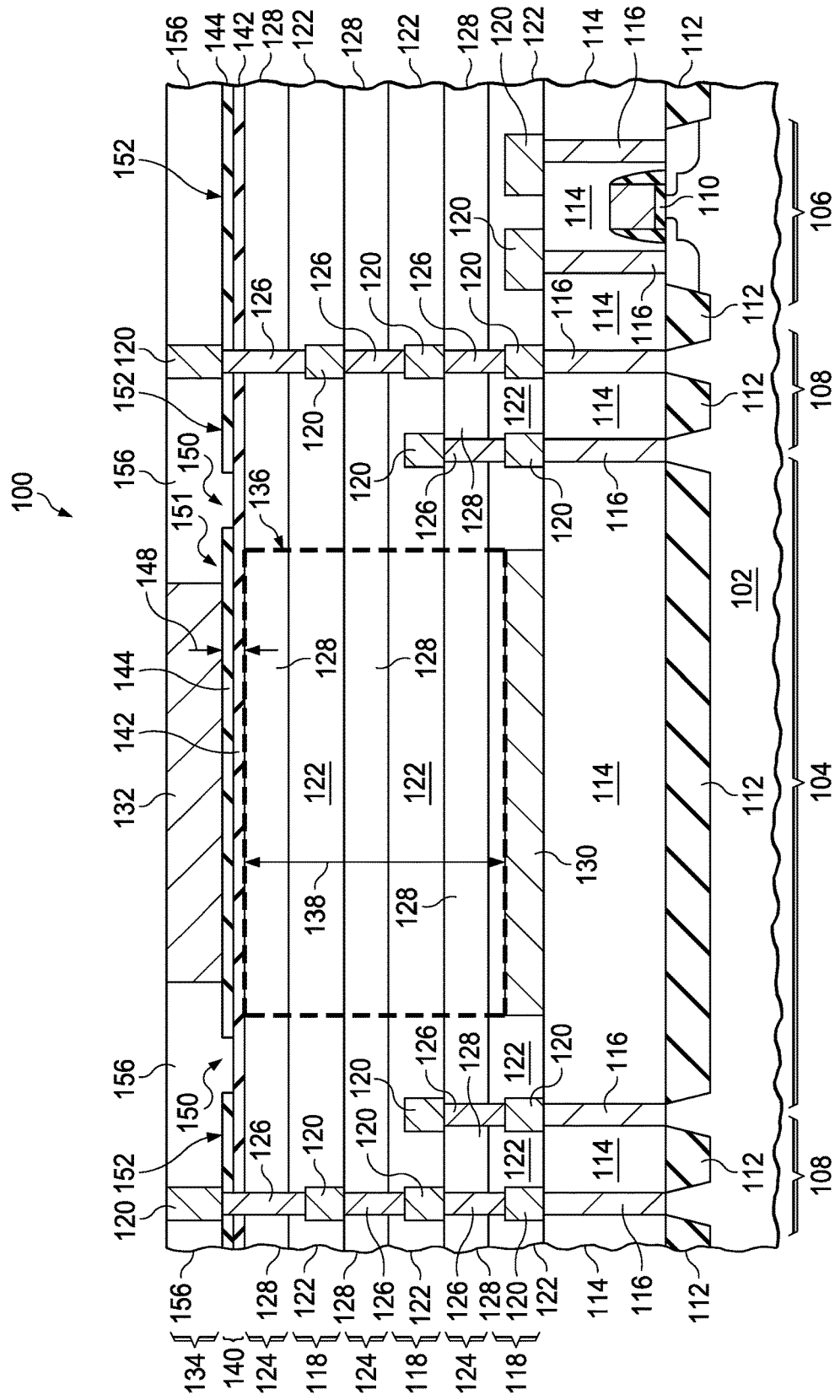

Referring to FIG. 2F, the IMD layer 156 above the lower-bandgap dielectric layer 140 is formed, and the IMD layer 156 abuts the isolation break 150. The IMD layer 122 above the lower-bandgap dielectric layer 140 may be formed by any of the methods described in reference to FIG. 2a. Forming the IMD layer 122 to abut the isolation break 150 advantageously prevents leakage current through an interface of the lower-bandgap dielectric layer 140 from the high voltage node 132 to a low voltage element of the microelectronic device 100. Formation of the microelectronic device 100 continues with formation of the protective overcoat 160 to subsequently provide the structure of FIG. 1.

Figure 3C:
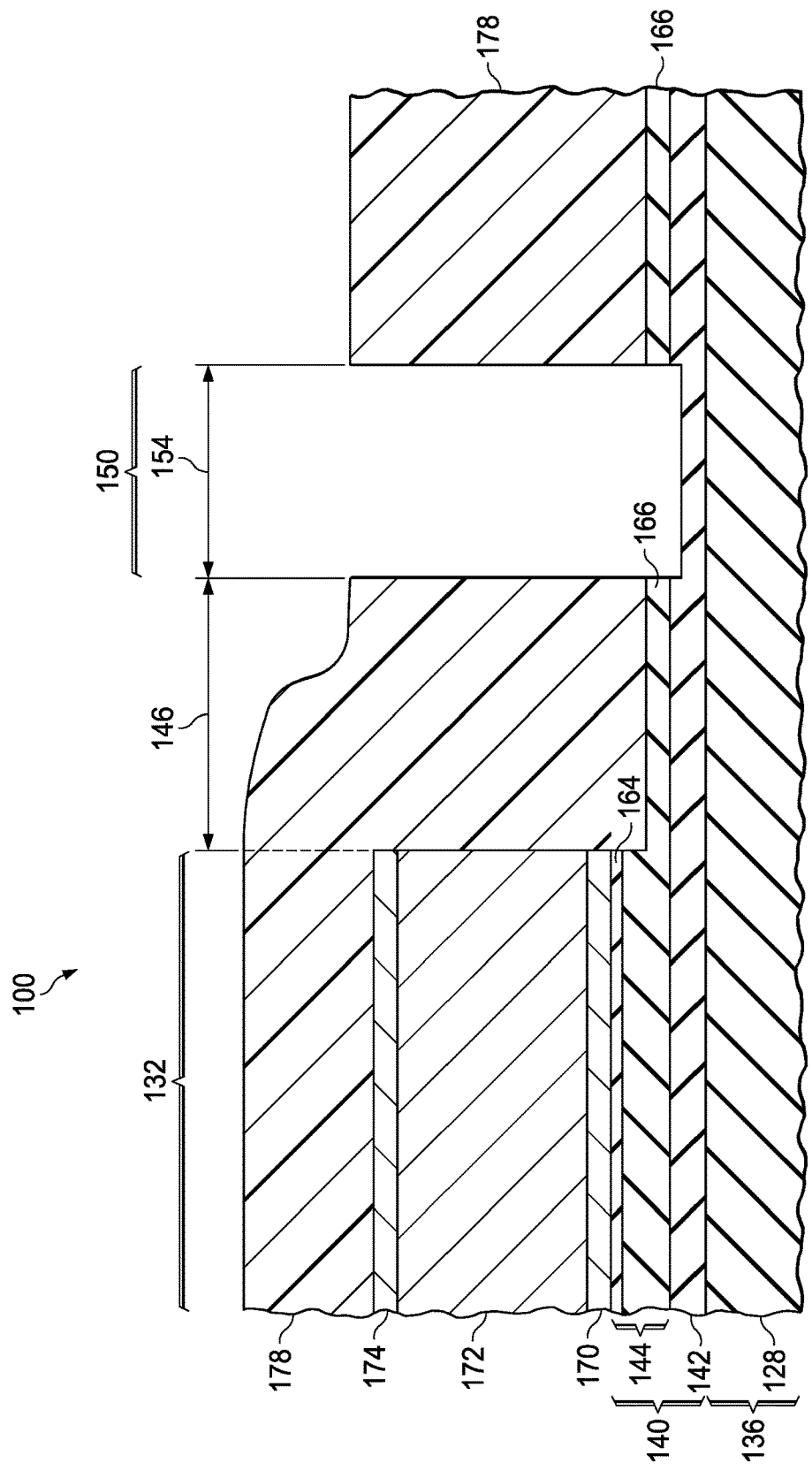

FIG. 3A through FIG. 3D are cross sections of the microelectronic device of FIG. 1 at the isolation break, depicting an alternate method of forming the isolation break and high voltage node. Referring to FIG. 3A, the microelectronic device 100 is fabricated as described in reference to FIG. 2A through FIG. 2C. The lower-bandgap dielectric layer 140 is formed over the ILD layer 128 at a top of the main dielectric 136. In the instant example, the lower-bandgap dielectric layer 140 includes the first sub-layer 142 formed on the ILD layer 128 and the second sub-layer 144 formed on the first sub-layer 142. After formation of the second sub-layer 144, an oxidizing process, for example an ash process, forms an oxygen-rich top region 164 at a top of the second sub-layer 144. The oxygen-rich top region 164 may be less than 30 nanometers thick. A lower region 166 of the second sub-layer 144 is substantially unchanged by the oxidizing process.

A layer of interconnect metal 168 is formed on the lower-bandgap dielectric layer 140. The layer of interconnect metal 168 includes an adhesion layer 170 of titanium, titanium tungsten or titanium nitride, 2 nanometers to 15 nanometers thick, formed by a sputter process or a reactive sputter process. The layer of interconnect metal 168 further includes an aluminum layer 172 formed on the adhesion layer 170. The aluminum layer 172 may include a few percent of silicon, titanium and/or copper. The aluminum layer 172 may be 200 nanometers to several microns thick, formed by a sputter process. The layer of interconnect metal 168 also includes an anti-reflection layer 174 of titanium nitride, 10 nanometers to 20 nanometers thick, formed by a reactive sputter process on the aluminum layer 172. Other configurations for the layer of interconnect metal 168 are within the scope of the instant example.

An interconnect mask 176 is formed over the layer of interconnect metal 168 so as to cover areas for the metal interconnects 120 of FIG. 1 above the lower-bandgap dielectric layer 140 and the high voltage node 132. The interconnect mask 176 may include photoresist formed by a photolithographic process, and may also include an anti-reflection layer and/or a hard mask layer. FIG. 3A depicts a portion of the interconnect mask 176 over an edge of the subsequently-formed high voltage node 132.

Referring to FIG. 3B, an interconnect etch process removes the layer of interconnect metal 168 in areas exposed by the interconnect mask 176, leaving the high voltage node 132 and the metal interconnects 120 of FIG. 1 above the lower-bandgap dielectric layer 140. In the instant example, the interconnect etch process further removes a portion, but not all, of the second sub-layer 144 of the lower-bandgap dielectric layer 140 in the areas exposed by the interconnect mask 176. The interconnect mask 176 is subsequently removed, for example by an ash process. At least 10 nanometers of the second sub-layer 144 remains in the areas exposed by the interconnect mask 176 after the interconnect etch process is completed and the interconnect mask 176 is removed.

Referring to FIG. 3C, an isolation etch mask 178 is formed over the high voltage node 132 and the lower-bandgap dielectric layer 140 so as to expose an area for the isolation break 150. The isolation etch mask 178 may include photoresist formed by a photolithographic process. The area for the isolation break 150 is laterally separated from the high voltage node 132 by the distance 146 as described with reference to FIG. 1. The width 154 of the area for the isolation break 150 is also described with reference to FIG. 1. The width 154 may be 10 microns to 25 microns to advantageously facilitate the photolithographic process for formation of the first isolation etch mask 178 with a desired level of process margin. An isolation etch process removes the second sub-layer 144 in the area exposed by the first isolation etch mask 178. In the instant example, the isolation etch process may remove a portion, but not all, of the first sub-layer 142 in the area for the isolation break 150. The first isolation etch mask 178 is subsequently removed, for example by an ash process.

FIG. 4A through FIG. 4F are cross sections of the microelectronic device of FIG. 1 at the isolation break, depicting another method of forming the isolation break and high voltage node. Referring to FIG. 5A, the microelectronic device 100 is fabricated as described in reference to FIG. 2A through FIG. 2C. The lower-bandgap dielectric layer 140 is formed over the ILD layer 128 at a top of the main dielectric 136. In the instant example, the lower-bandgap dielectric layer 140 includes the first sub-layer 142 formed on the ILD layer 128, the second sub-layer 144 formed on the first sub-layer 142, and a third sub-layer 196 formed on the second sub-layer 144. A bandgap energy of the first sub-layer 142 may be less than a bandgap energy of the ILD layer 128 at a top of the main dielectric 136. A bandgap energy of the second sub-layer 144 may be less than the bandgap energy of the first sub-layer 142. A bandgap energy of the third sub-layer 196 may be less than the bandgap energy of the second sub-layer 144.

Figure 4A:
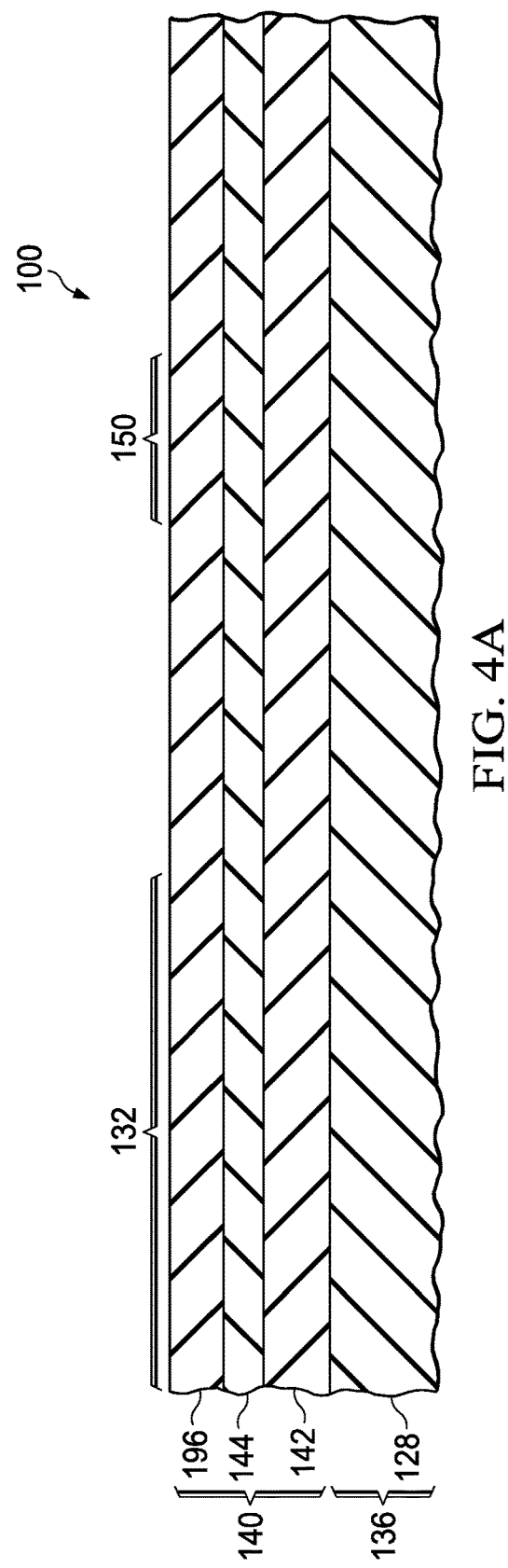
FIG. 4A through FIG. 4F are cross sections of the microelectronic device of FIG. 1 at the isolation break, depicting a further alternate method of forming the isolation break and high voltage node.
Figure 4B:
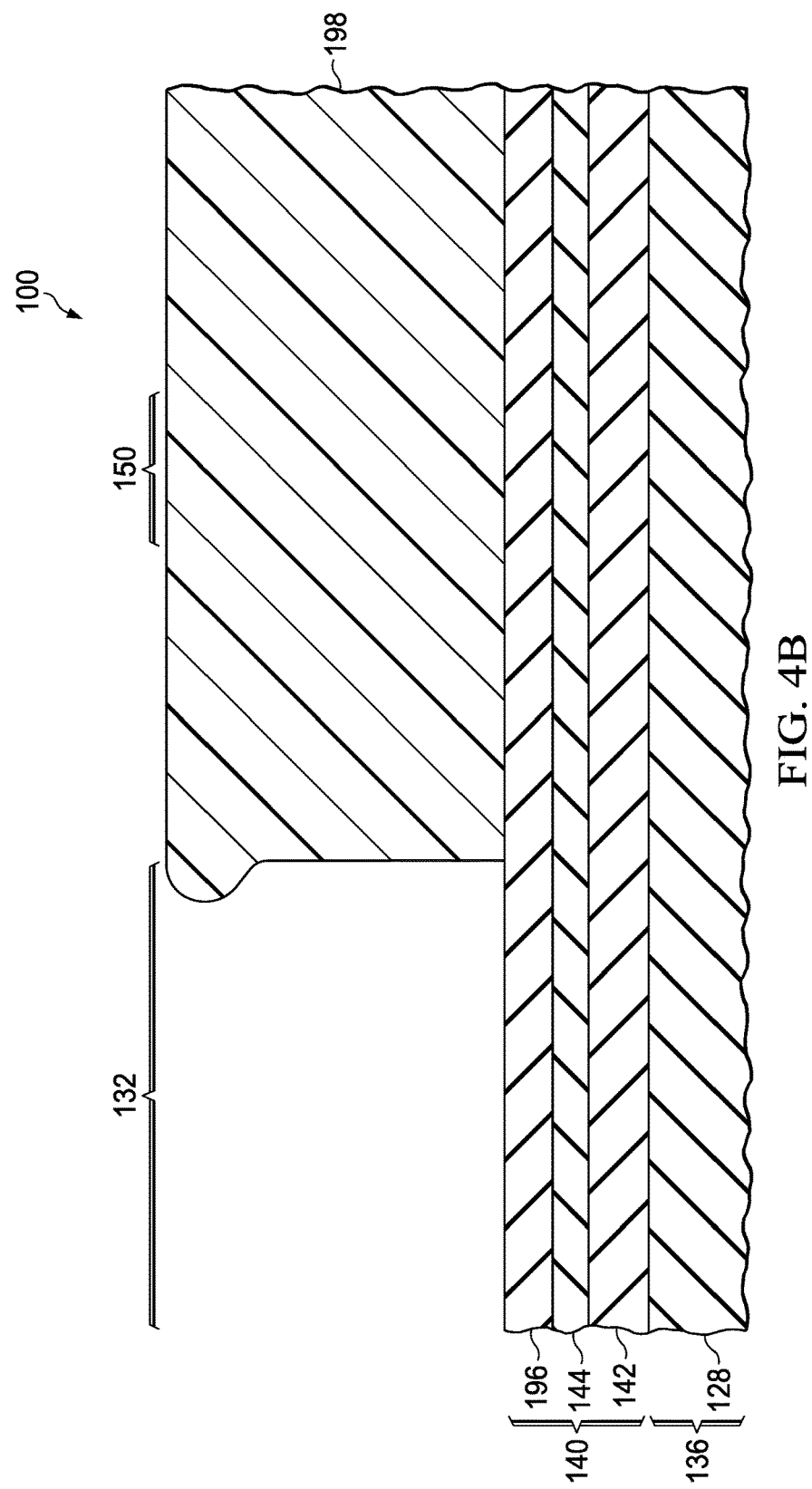

Referring to FIG. 4B, a liftoff pattern 198 is formed over the lower-bandgap dielectric layer 140 so as to expose the area for the high voltage node 132 and cover areas outside the high voltage node 132 including the area for the isolation break 150. The liftoff pattern 198 may include positive tone photoresist containing novolak resin, and may be formed by a photolithographic process. A thickness of the liftoff pattern 198 is greater than a desired thickness of the subsequently-formed high voltage node 132.

Figure 4C:
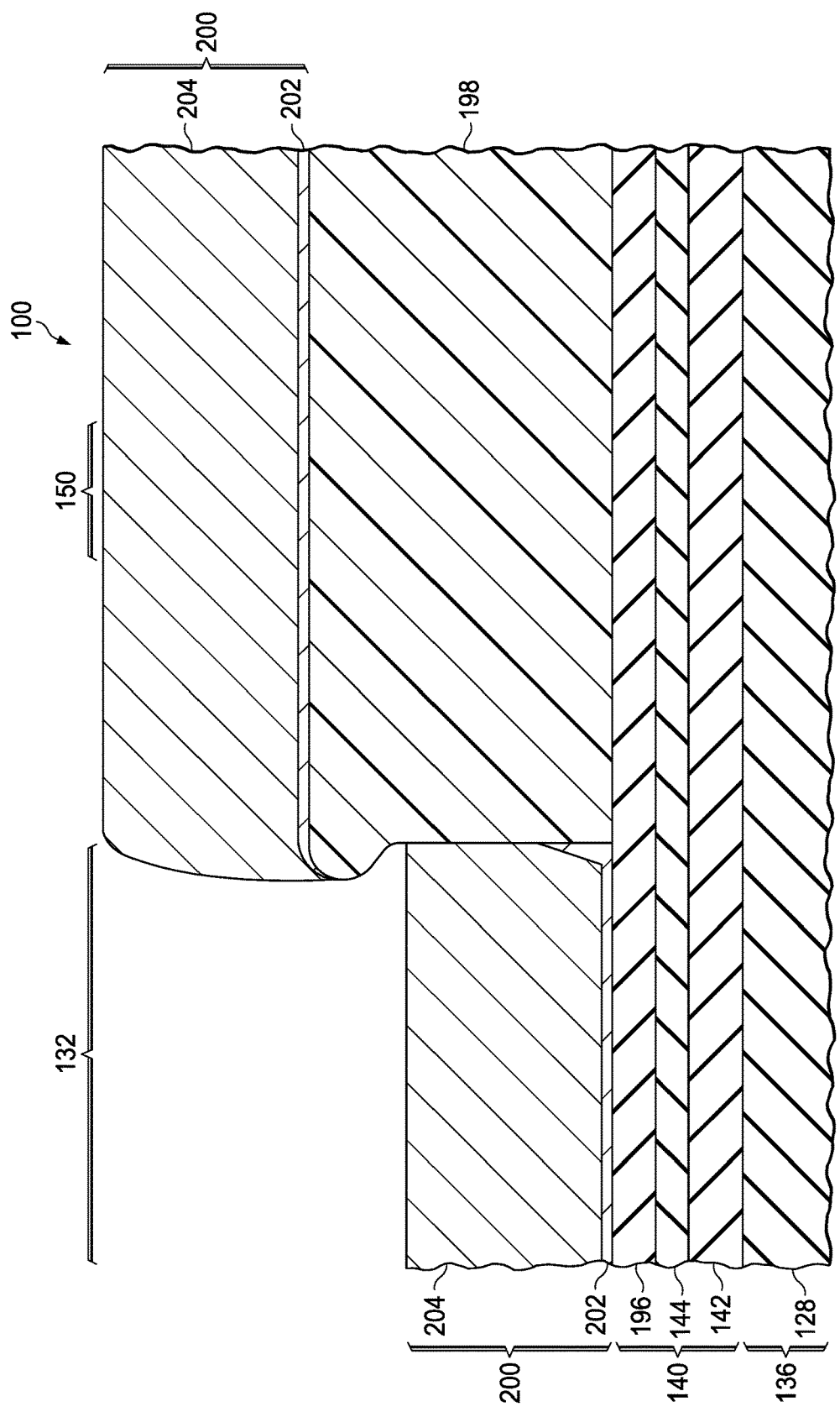

Referring to FIG. 4C, interconnect metal 200 is formed over the liftoff pattern 198 and on the lower-bandgap dielectric layer 140 in the area exposed by the liftoff pattern 198. The interconnect metal 200 includes an adhesion layer 202 of evaporated titanium and a fill metal 204 of evaporated aluminum or gold. A profile of the liftoff pattern 198 may advantageously assist formation of a discontinuity in the interconnect metal 200 at an edge of the liftoff pattern. The liftoff pattern 198 is subsequently removed, for example by a solvent spray process, which concurrently removes the interconnect metal 200 over the liftoff pattern 198 and leaves the interconnect metal 200 on the lower-bandgap dielectric layer 140 in the area exposed by the liftoff pattern 198 to form the high voltage node 132.

Figure 4D:
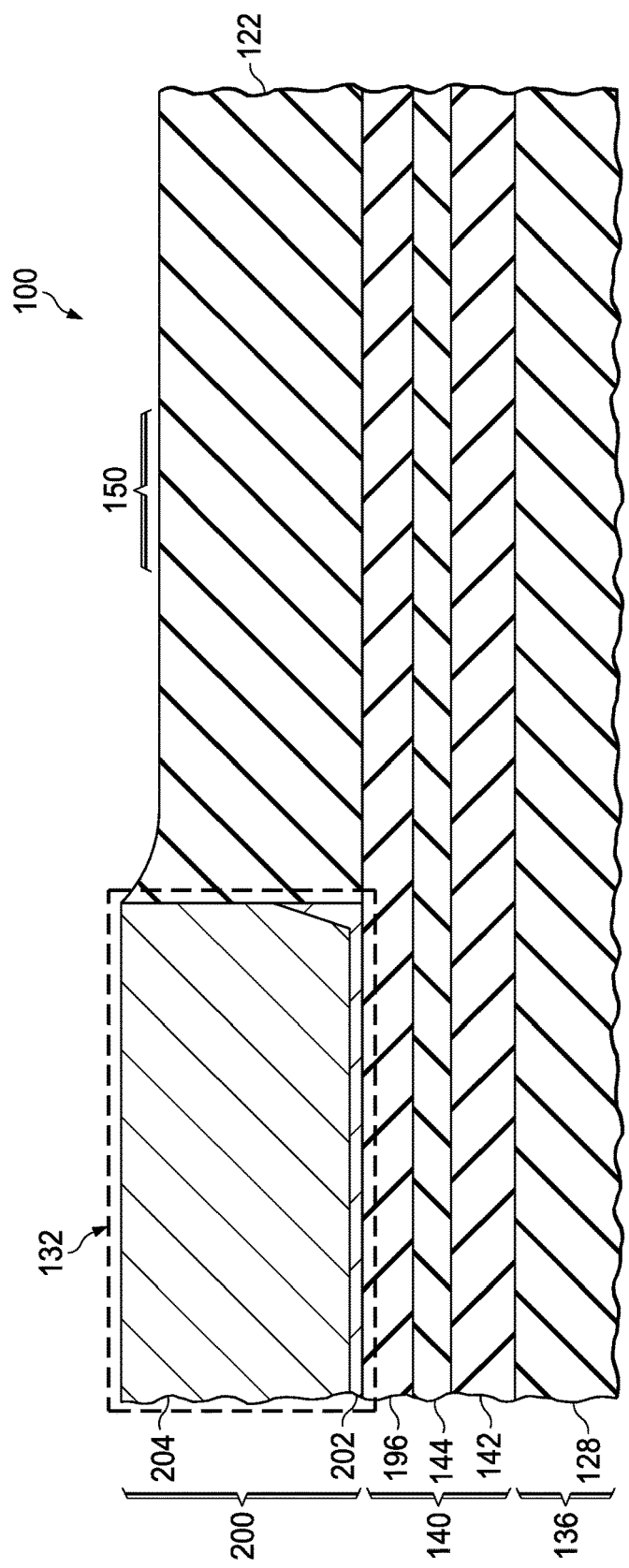

Referring to FIG. 4D, the IMD layer 122 above the lower-bandgap dielectric layer 140 is formed. The IMD layer 122 may be formed by spin coating the microelectronic device 100 with a solution containing MSQ. The solution is subsequently baked to removed volatile material, leaving the IMD layer 122 formed of a low-k silicon-dioxide based dielectric material, possibly covering the high voltage node 132. A subsequent blanket etch may recess the IMD layer 122 to expose a top surface of the high voltage node 132 as depicted in FIG. 4D.

Figure 4E:
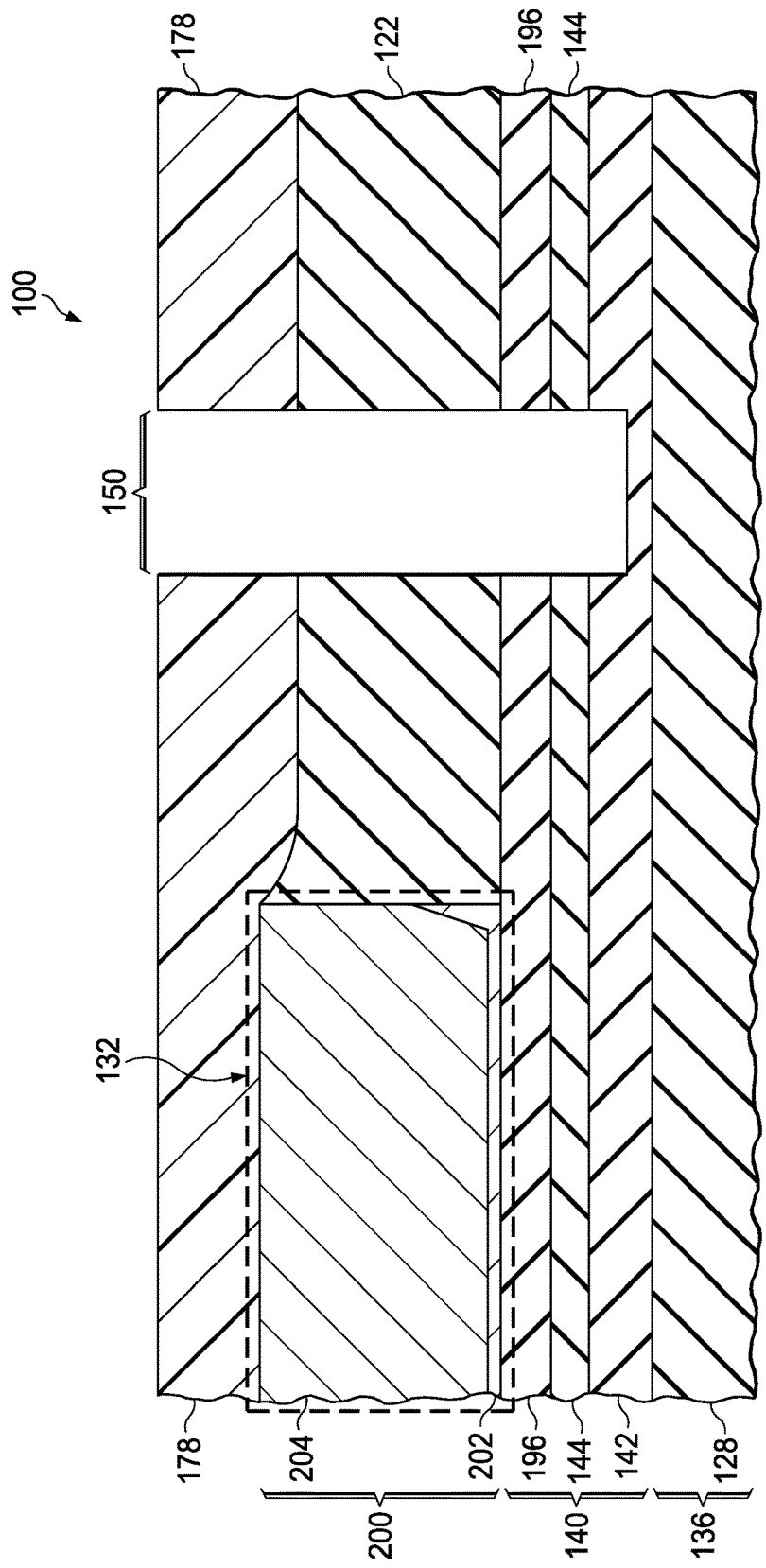

Referring to FIG. 4E, an isolation etch mask 178 is formed over the high voltage node 132 and the IMD layer 122 so as to expose an area for the isolation break 150. An isolation etch process removes the third sub-layer 196, the second sub-layer 144 and at least a portion, and possibly all, of the first sub-layer 142 in the area for the isolation break 150. The isolation etch mask 178 is subsequently removed, for example by an ash process. Forming the isolation etch mask 178 after forming the IMD layer 122 provides a more planar topology for the isolation etch mask 178 and may advantageously provide desired process margin for fabrication of the microelectronic device 100.

Figure 4F:
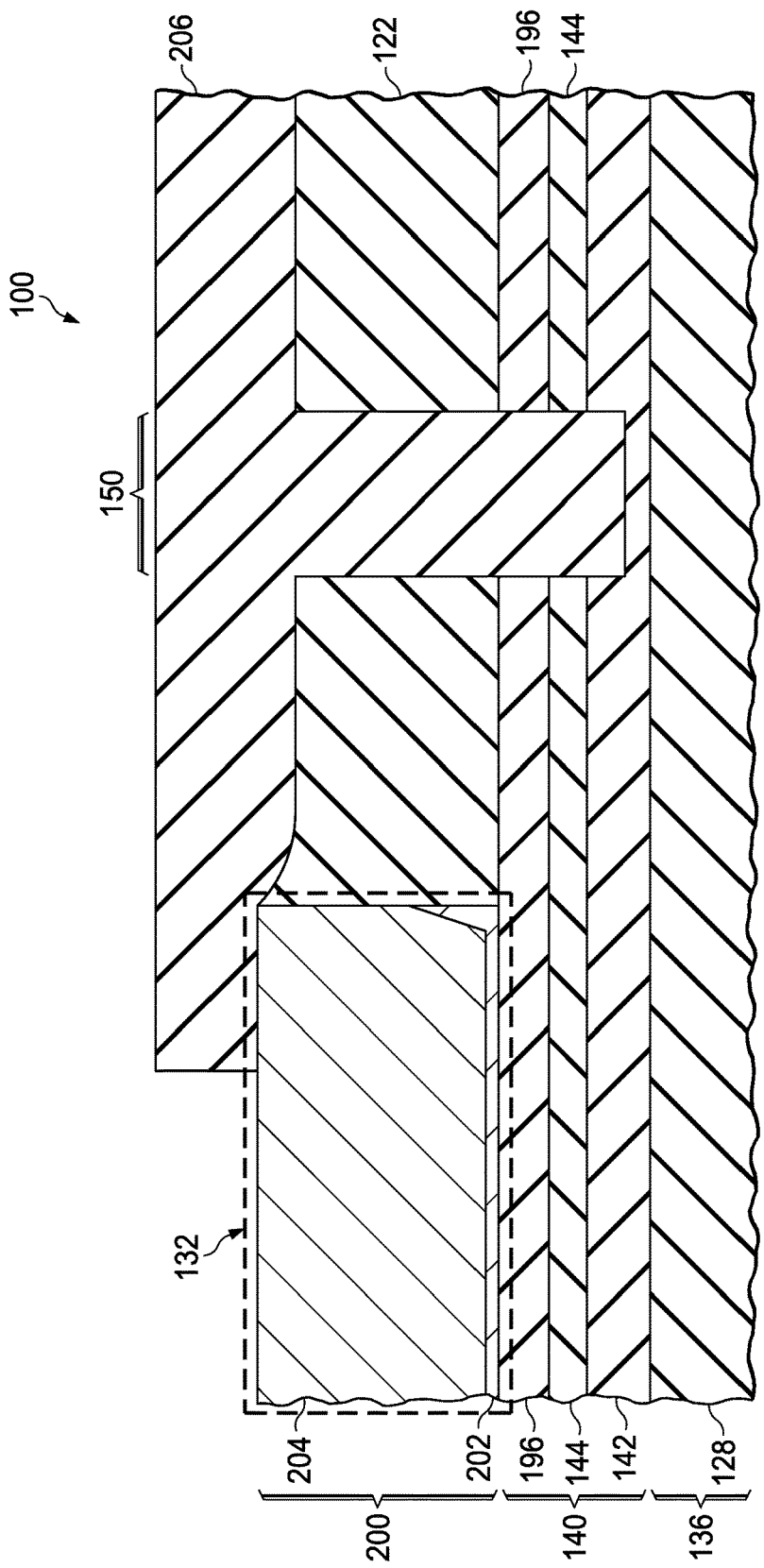

Referring to FIG. 4F, a dielectric layer 206 is formed over the IMD layer 122, extending into the cavity formed by the isolation etch process and contacting the lower-bandgap dielectric layer 140 at the isolation break 150. The dielectric layer 206 may be, for example, the protective overcoat 160 of FIG. 1. The dielectric layer 206 advantageously provides reliability by preventing leakage current through the lower-bandgap dielectric layer 140 at the isolation break 150.

For galvanic isolation capacitors, the high voltage breakdown strength and surge hysteresis capability correlates to the electric field enhancement associated with the periphery of the finite capacitor plates. This correlation may be weakened by reducing the electron injection density at the periphery of the capacitor plate into the primary dielectric, thereby increasing the breakdown strength of the capacitor.

The present disclosure provides a "SiN/Oxynitride" (hereinafter "SO") bilayer under the top capacitor plate to achieve enhanced isolation performance. A sub-layer of this SO bilayer is cut away near the top capacitor plate to prevent lateral breakdown between the high voltage top capacitor plate and the low voltage surrounding circuitry in the die. Landing the cut near (e.g., slightly above or into) the underlying first bandgap sub-layer (e.g., a SiON (Land-in SiON, or "LiSiON") layer) achieves improved surge capability without any other apparent penalty. Thus, the present disclosure provides a lower-cost process as well. By not etching all the way through the SO bilayer, the landing within the oxynitride layer may achieve a 600V (~4%) breakdown strength improvement and a 1.5 kV (7%) improvement in surge performance. More specifically, one implementation includes an SO removal (SOR) cutout that preserves at least some of the SiON material under the completely removed SiN layer. As such, a 3-pulse bipolar surge hysteresis capability may be improved by ~1.5 kV (from 20 kV to 21.5 kV) compared to current industry-leading baseline capability.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:
1. An integrated circuit, comprising:
a substrate;
a lower conductive plate above the substrate;
a first dielectric layer above the lower conductive plate, the first dielectric layer having a first bandgap energy;
a second dielectric layer having a second bandgap energy lower than the first bandgap energy, the second dielectric layer including a first sub-layer above the first dielectric layer, and a second sub-layer above the first sub-layer;
an isolation break extending into the second sub-layer and terminated near the first sub-layer, the isolation break dividing the second sub-layer into:
a first portion co-extending with the lower conductive plate; and
a second portion free of overlapping with the lower conductive plate; and
an upper conductive plate above the second sub-layer and circumscribed by the isolation break.

2. The integrated circuit of claim 1, wherein:
the first sub-layer having the second bandgap energy; and
the second sub-layer having a third bandgap energy lower than the second bandgap energy.

3. The integrated circuit of claim 1, wherein the second dielectric layer includes a silicon nitride layer.

4. The integrated circuit of claim 1, wherein the second dielectric layer includes a silicon oxynitride layer.

5. The integrated circuit of claim 1, wherein the second dielectric layer includes:
a silicon oxynitride layer on the first dielectric layer;
a silicon nitride layer on the silicon oxynitride layer.

6. The integrated circuit of claim 1, wherein the first portion of the second sub-layer extends beyond the lower conductive plate.

7. The integrated circuit of claim 1, wherein the first dielectric layer has a thickness of at least 2 microns.

8. The integrated circuit of claim 1, wherein the upper conductive plate is smaller than the lower conductive plate.

9. The integrated circuit of claim 1, wherein the upper conductive plate sized equally with the lower conductive plate.

10. The integrated circuit of claim 1, further comprising:
a circuit under the second portion of the second sub-layer, the circuit coupled to an interconnect layer for receiving a first voltage; and
a bond pad on the upper conductive plate for receiving a second voltage substantially higher than the first voltage.

11. The integrated circuit of claim 1, wherein the first portion of the second sub-layer extends beyond the lower conductive plate.

12. The integrated circuit of claim 1, wherein the first portion of the second sub-layer has a thickness and extends beyond the upper conductive plate by at least a distance twice of the thickness.

13. The integrated circuit of claim 1, wherein:
the first sub-layer having the second bandgap energy; and
the second sub-layer having a third bandgap energy lower than the second bandgap energy.

14. An integrated circuit, comprising:
a substrate;
a lower conductive plate above the substrate;
a first dielectric layer above the lower conductive plate, the first dielectric layer having a first bandgap energy;
a second dielectric layer having a second bandgap energy lower than the first bandgap energy, the second dielectric layer including:

a first sub-layer above the first dielectric layer and contiguously coextending with the first dielectric layer; and a second sub-layer on the first sub-layer, the second sub-layer segregated into a first portion co-extending with the lower conductive plate, and a second portion free of overlapping with the lower conductive plate and spaced apart from the first portion; and an upper conductive plate above and within the first portion the second dielectric layer.

15. The integrated circuit of claim 11, wherein the second dielectric layer includes a silicon nitride layer.

16. The integrated circuit of claim 11, wherein the second dielectric layer includes a silicon oxynitride layer.

17. The integrated circuit of claim 11, wherein the second dielectric layer includes:

a silicon oxynitride layer on the first dielectric layer;
a silicon nitride layer on the silicon oxynitride layer.

18. The integrated circuit of claim 11, wherein the first dielectric layer has a thickness of at least 2 microns.

19. The integrated circuit of claim 11, further comprising:

a circuit under the second portion of the second sub-layer, the circuit coupled to an interconnect layer for receiving a first voltage; and a bond pad on the upper conductive plate for receiving a second voltage substantially higher than the first voltage.

20. The integrated circuit of claim 11, further comprising:

an isolation break laterally surrounding the first portion of the second sub-layer and isolating the first portion of the second sub-layer from the second portion of the second sub-layer, the isolation break having a third bandgap energy higher than the second bandgap energy.

* * * * *